US005317257A

United States Patent [19]
Sakai

[11] Patent Number: 5,317,257
[45] Date of Patent: May 31, 1994

[54] BURN-IN APPARATUS AND BURN-IN BOARD REMOVING METHOD USING MOVABLE COOLING ENCLOSURE

[75] Inventor: Iwao Sakai, Itami, Japan

[73] Assignee: Mitsubishi Denki Kabushiki Kaisha, Tokyo, Japan

[21] Appl. No.: 998,775

[22] Filed: Dec. 29, 1992

Related U.S. Application Data

[63] Continuation of Ser. No. 715,926, Jun. 14, 1991, abandoned.

[30] Foreign Application Priority Data

Nov. 28, 1990 [JP] Japan .................................. 2-322290

[51] Int. Cl.⁵ .............................................. G01R 1/02
[52] U.S. Cl. .............................. 324/158 F; 324/158 R
[58] Field of Search .............. 324/158 F, 158 P, 72.5, 324/158 R; 361/412, 415, 383–385; 219/209, 210; 165/80.3, 80.4; 901/8, 50

[56] References Cited

U.S. PATENT DOCUMENTS

| | | | |
|---|---|---|---|
| 4,374,317 | 2/1983 | Bradshaw | 219/201 |
| 4,674,004 | 6/1987 | Smith et al. | 361/384 |
| 4,758,924 | 7/1988 | Dillon et al. | 361/384 |
| 4,901,011 | 2/1990 | Koike et al. | 324/158 F |
| 4,902,969 | 2/1990 | Gussman | 324/158 F |
| 5,003,156 | 3/1991 | Kilpatrick et al. | 219/209 |

*Primary Examiner*—Vinh Nguyen
*Attorney, Agent, or Firm*—Leydig Voit & Mayer

[57] ABSTRACT

A burn-in apparatus includes a robot for supplying and removing burn-in boards. The robot includes a movable enclosure capable of temperature control. In a burn-in board removing method, a burn-in board which is to be removed from the chamber of a burn-in apparatus body is enclosed by the movable enclosure of the robot. The interior of the movable enclosure is then cooled to normal temperatures by means of a cooling mechanism. Subsequently, power supply to semiconductor IC's on the burn-in board is suspended, and the burn-in board is removed. In this way, disappearance of failures generated by the charging-up during the burn-in can be prevented, and a burn-in test can be accurately conducted.

11 Claims, 3 Drawing Sheets

BURN-IN APPARATUS AND BURN-IN BOARD REMOVING METHOD USING MOVABLE COOLING ENCLOSURE

This application is a continuation of application Ser. No. 07/715,926, filed Jun. 14, 1991, now abandoned.

BACKGROUND OF THE INVENTION

Field of the Invention

This invention relates to a burn-in apparatus for conducting burn-in on semiconductor IC's and a burn-in board removing method.

Description of the Related Art

FIG. 2 is a schematic perspective view of a conventional burn-in apparatus. A burn-in apparatus body 1 has a single large burn-in chamber 3 in which a large number of burn-in boards 2 are accommodated and in which a burn-in test is conducted on semiconductor IC's (not shown) placed on each of the burn-in boards 2. The burn-in chamber 3 has on its front a plurality of doors 4 through which the burn-in boards 2 are inserted into and removed from the burn-in chamber 3 by means of a robot 5 which is movable along rails 6 provided in front of the burn-in chamber 3. At least one burn-in board 2 is removed from the burn-in chamber 3 in one operation.

In the thus-arranged conventional burn-in apparatus, the burn-in boards 2 which are subjected to the burn-in process for a fixed period of time are removed from the burn-in chamber through the open doors 4 provided at the front thereof by means of the robot 5 in a high-temperature state after the supply of power to the semiconductor IC's is turned off.

In the conventional burn-in apparatus of the above-described type, the burn-in boards 2 in the large number of burn-in boards, which are subjected to the burn-in process for the fixed period of time, are selectively removed in a high-temperature state from the chamber. However, turning off of the power supply to the semiconductor IC's at a high temperature causes the semiconductor IC's to enter an annealed state. This may cause failure generated by Fbt charging-up during the burn-in process to disappear, so that faulty IC's can not be detected.

SUMMARY OF THE INVENTION

Accordingly, an object of the present invention is to provide a burn-in apparatus which is capable of removing a burn-in board which is subjected to a burn-in operation for a fixed period of time from a burn-in apparatus body after the board has been cooled to normal temperatures and the power supply has been turned off, as well as a burn-in board removing method.

In order to achieve the above object, according to one aspect of the present invention, there is provided a burn-in apparatus which comprises a burn-in apparatus body having a burn-in chamber in which burn-in boards are accommodated and in which the burn-in boards are heated and subjected to a burn-in test, a robot for supplying the burn-in boards into and removing the burn-in boards from the burn-in chamber, and a movable enclosure provided on the robot, the movable enclosure enclosing and cooling the a burn-in board to be removed to normal temperature within the burn-in chamber.

According to another aspect of the present invention, there is provided a burn-in board removing method which comprises the steps of enclosing a burn-in board accommodated in a burn-in chamber provided in a burn-in board apparatus body and subjected to a burn-in for a predetermined period of time by means of a movable enclosure, cooling the burn-in board to normal temperatures by means of a cooling means provided in the movable enclosure, suspending the supply of power to semiconductor IC's placed on the burn-in board, and removing the burn-in board from within the chamber together with the movable enclosure.

DETAILED OF THE PREFERRED EMBODIMENT

Figure 1:
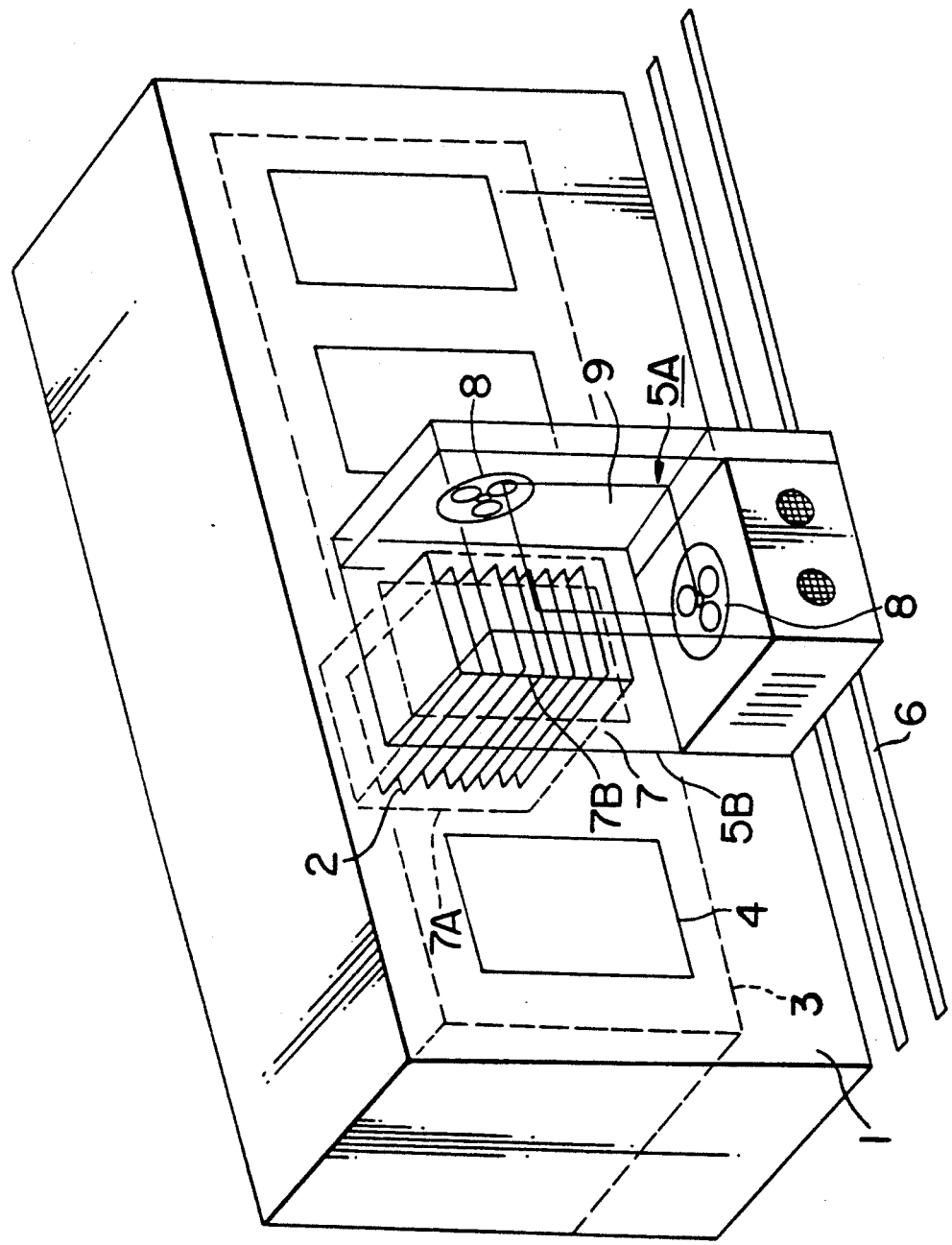
FIG. 1 is a schematic perspective view of an embodiment of a burn-in apparatus according to the present invention.
Figure 2:
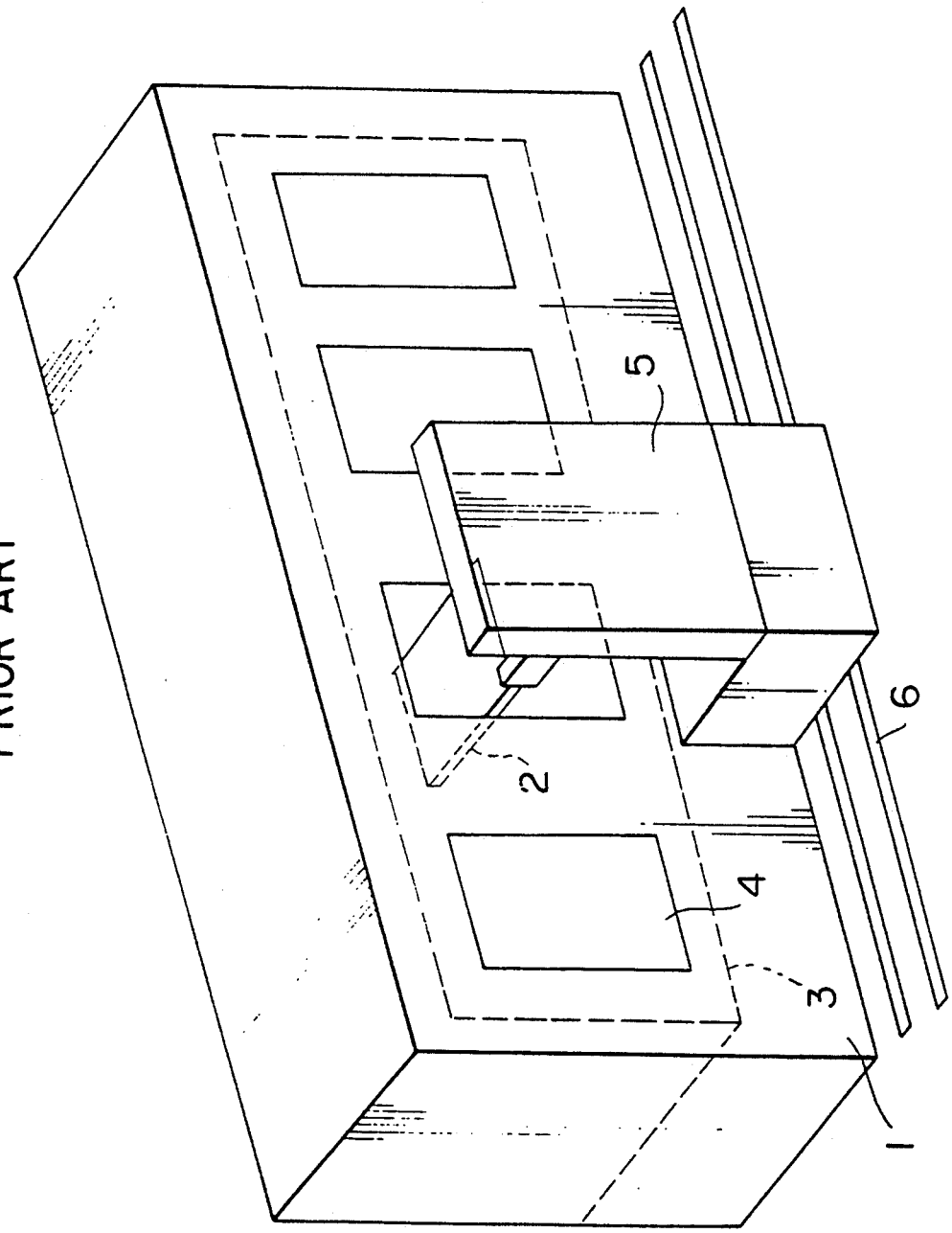
FIG. 2 is a schematic perspective view of a conventional burn-in apparatus.

FIG. 1 is a schematic perspective view of an embodiment of a burn-in apparatus according to the present invention. In FIG. 1, the parts which are denoted by reference numerals 1 to 4 and 6 are the same as those of the conventional burn-in apparatus shown in FIG. 2. A robot 5A foresupplying and removing the burn-in boards 2 has a movable enclosure 7 which is capable of enclosing the burn-in board 2 and an outer chamber 5B disposed outside the burn-in apparatus body 1 and having a space for receiving the movable enclosure 7. The movable enclosure 7 has an inner end 7A with an opening through which a burn-in board can be inserted. The movable enclosure 7 also has an outer end 7B with an opening communicating with the space inside the outer chamber 5B. The robot 5A also has a cooling mechanism 8 for cooling the burn-in board 2 enclosed by the movable enclosure 7. As shown in FIG. 1, the cooling mechanism 8 may be a fan which is disposed in the outer chamber 5B and which sends out cooled air.

In the burn-in apparatus arranged in the manner described above, the burn-in board 2 which is subjected to the burn-in process for a fixed period of time is removed from the burn-in chamber by means of the robot 5A through the door provided at the corresponding position. That is, first, the movable enclosure 7 provided on the robot 5A opens the door 4, enters the burn-in chamber 3, and then encloses the burn-in board 2 to be removed. Next, the space enclosed by the movable enclosure 7 is cooled to normal temperatures by means of the cooling mechanism 8. After the burn-in board 2 has been cooled, supply of power to the semiconductor IC's is suspended and the burn-in board 2 is then pulled out. Subsequently, the movable enclosure 7 with the burn-in board 2 accommodated therein is pulled into the outer chamber 5B of the robot 5A, and the burn-in board 2 is then taken out through a port 9 formed in the outer end of the outer chamber 5B.

In this way, the burn-in board 2 is removed from the chamber 3 after being cooled to normal temperatures, and disappearance of failures generated by charging-up during burn-in can thus be eliminated.

Figure 3:
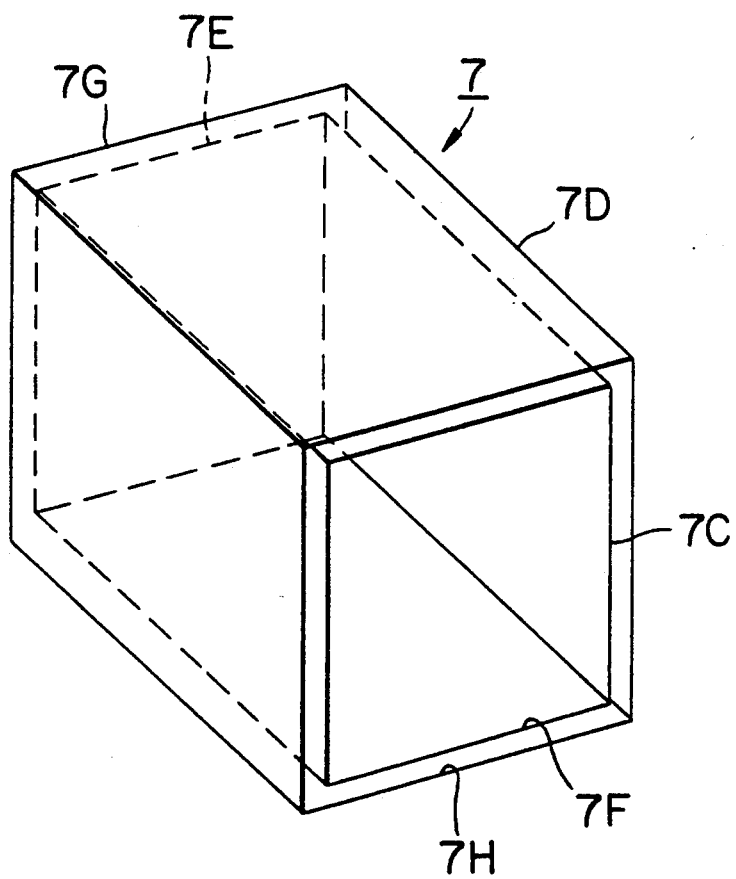
FIG. 3 is a schematic view of a double-skinned movable enclosure.

In the above embodiment, the movable enclosure 7 has a box-like shape which allows it to cover the burn-in board 2. However, as schematically shown in FIG. 3, the movable enclosure 7 may have a double-skinned box-like shape with cooling and heating mechanisms provided therein. In FIG. 3, the movable enclosure 7 includes an inner portion 7C and an outer portion 7D. The inner portion 7C of the movable enclosure 7 has an inner end 7E and an outer end 7F each having an opening formed therein. Likewise, the outer portion 7D of the movable enclosure 7 has an inner end 7G and an outer end 7H each having an opening formed therein. In this case, after the space within the movable enclosure is cooled to normal temperatures and the burn-in board is pulled out by the movable enclosure only the inner portion 7B with the burn-in board accommodated therein is returned to the robot while the outer portion 7D is left within the chamber 3. The outer portion 7D is returned to the interior of the robot after a interior thereof is heated to the temperature substantially the same as that of the interior of the chamber 3. In this way, reduction in the temperature of the interior of the chamber 3 can be prevented. As a result, influence on the burn-in boards remaining in the chamber 3 can be reduced, and accuracy of the burn-in test can thus be improved.

A movable enclosure with cooling and heating mechanisms provided therein may also be used to achieve normal-temperature supply of the burn-in board. In that case, after the supply of power to the semiconductor IC's on the burn-in board cooled to normal temperature is turned on within the high-temperature chamber, the burn-in board cooled to normal temperatures is heated to the a temperature substantially the same as that of the interior of the chamber by means of the heating mechanism. In this way, it is possible to prevent an excess burden from being imposed on the semiconductor IC's.

What is claimed is:

1. A burn-in apparatus comprising:
   a burn-in apparatus body having a burn-in chamber in which burn-in boards are heated and subjected to a burn-in test; and
   a robot for supplying a burn-in boards into and removing the burn-in boards from the burn-in chamber, the robot comprising:
      a movable enclosure movable between a position outside of the burn-in chamber and a position inside the burn-in chamber in which the movable enclosure surrounds a burn-in board disposed inside the burn-in chamber; and
      a cooling means for cooling the inside of the movable enclosure while the movable enclosure is disposed inside the burn-in chamber.

2. A burn-in apparatus as claimed in claim 1 wherein the robot comprises:
   an outer chamber disposed outside the burn-in apparatus body and including a space for receiving the movable enclosure,
   wherein the cooling means comprises a cooling fan disposed for cooling the space within the outer chamber.

3. A burn-in apparatus as claimed in claim 2 wherein the movable enclosure has an outer end with an opening formed therein communicating with the space inside the outer chamber.

4. A burn-in apparatus as claimed in claim 3 wherein the movable enclosure has an inner end with an opening formed therein through which a burn-in board can pass.

5. A burn-in apparatus as claimed in claim 2 wherein the outer chamber includes an opening through which a burn-in board can be removed from the movable enclosure.

6. A burn-in apparatus as claimed in claim 1 wherein the movable enclosure comprises an inner portion and an outer portion surrounding the inner portion and movable into an out of the burn-in chamber independently of the inner portion.

7. A method of removing a burn-in board from a burn-in apparatus comprising the steps of:
   enclosing a burn-in board accommodated in a burn-in chamber of a burn-in board apparatus with a movable enclosure after a semiconductor IC on the burn-in board has been subjected to burn-in and while the burn-in board is at a first temperature above normal temperature and electric power is being supplied to the IC;
   cooling the inside of the movable enclosure to a second temperature below the first temperature;
   suspending the supply of power to the semiconductor IC on the burn-in board after the inside of the movable enclosure reaches the second temperature; and
   removing the burn-in board from within the burn-in chamber.

8. A method as claimed in claim 7 wherein the second temperature is below a temperature at which the IC can anneal when the supply of power is suspended.

9. A burn-in apparatus comprising:
   a burn-in apparatus body having a burn-in chamber for accommodating a plurality of burn-in boards; and
   a robot for supplying burn-in boards into and removing burn-in boards from the burn-in chamber, the robot comprising:
      a movable enclosure movable between a position outside of the burn-in chamber and a position inside the burn-in chamber in which the movable enclosure surrounds a plurality of burn-in boards disposed inside the burn-in chamber such that the temperature of burn-in boards surrounded by the enclosure within the burn-in chamber can be different from the temperature of portions of the burn-in chamber outside the enclosure.

10. A method of removing a burn-in board from a burn-in apparatus comprising:
    enclosing a burn-in board accommodated in a burn-in chamber of a burn-in apparatus with a movable enclosure;
    cooling the burn-in board enclosed by the movable enclosure to a temperature lower than the inside of the burn-in chamber surrounding the movable enclosure; and
    removing the burn-in board from the burn-in chamber.

11. A method of removing a burn-in board from a burn-in apparatus comprising:
    enclosing a burn-in board accommodated in a burn-in chamber of a burn-in apparatus with a movable enclosure comprising an inner portion surrounding the burn-in board and an outer portion surrounding the inner portion;
    cooling the inside of the movable enclosure to a temperature lower than the temperature inside the burn-in chamber surrounding the movable enclosure;
    removing the burn-in board and the inner portion of the movable enclosure from the burn-in chamber;
    raising the temperature of the inside of the outer portion of the movable enclosure to substantially the same temperature as the inside of the burn-in chamber; and
    removing the outer portion of the movable enclosure from the burn-in chamber.

* * * * *